(12) United States Patent
Jajodia et al.

(10) Patent No.: US 9,188,640 B1
(45) Date of Patent: Nov. 17, 2015

(54) SCAN FLIP-FLOP CIRCUIT WITH LOS SCAN ENABLE SIGNAL

(71) Applicants: Reecha Jajodia, Noida (IN); Gaurav Goyal, Noida (IN); Ateet Mishra, Delhi (IN)

(72) Inventors: Reecha Jajodia, Noida (IN); Gaurav Goyal, Noida (IN); Ateet Mishra, Delhi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 17 days.

(21) Appl. No.: 14/280,670

(22) Filed: May 19, 2014

(51) Int. Cl.
*G01R 31/3177* (2006.01)

(52) U.S. Cl.
CPC .................. *G01R 31/3177* (2013.01)

(58) Field of Classification Search
CPC . G01R 31/3177; H03K 3/012; H03K 3/0375; H03K 3/037; H03K 3/356121; H03K 3/356017
USPC .......................................................... 327/208
See application file for complete search history.

(56) References Cited

U.S. PATENT DOCUMENTS

| | | | |
|---|---|---|---|
| 5,015,875 A | 5/1991 | Giles et al. | |
| 5,175,447 A | 12/1992 | Kawasaki et al. | |
| 5,633,606 A | 5/1997 | Gaudet | |
| 6,426,649 B1 * | 7/2002 | Fu et al. | 326/41 |
| 7,596,732 B2 | 9/2009 | Branch et al. | |
| 7,843,218 B1 | 11/2010 | Ramaraju et al. | |
| 8,493,118 B2 | 7/2013 | Tam | |

OTHER PUBLICATIONS

N. Ahmed, C. P. Ravikumar, M. Tehranipoor, and J. Plusquellic, "Atspeed transition fault testing with low speed scan enable," in VTS '05: Proceedings of the 23rd IEEE VLSI Test Symposium, (Washington, DC, USA), pp. 42-47, IEEE Computer Society, 2005.
Rajesh Kumar and Sunil P. Khatri, "An efficient Flip-flop based Launch on Shift scan cell," ISDN 978-1-4244-5309-2/10, IEEE 2010.
Rubil Ahmadi, "A Power Efficient Hold-Friendly Flip-Flop," IEEE 978-1-4244-2332-3/0,8, 2008.
Mishra, A.; Sinha, N.; Satdev; Singh, V.; Chakravarty, S.; Singh, A.D., "Modified Scan Flip-Flop for Low Power Testing," Test Symposium (ATS), 2010 19th IEEE Asian , vol., no., pp. 367,370, Dec. 1-4, 2010.

* cited by examiner

*Primary Examiner* — John Poos
*Assistant Examiner* — David Mattison
(74) *Attorney, Agent, or Firm* — Charles Bergere

(57) ABSTRACT

A scan flip-flop for generating an output signal based on a first input signal, a clock signal, a test input signal, a Launch On Shift (LOS) signal, a test enable signal, and a reset signal includes a logic circuit, a multiplexer and a flip-flop circuit. The logic circuit receives an inverted clock signal, the test enable signal, a intermediate test enable signal, and the LOS signal, and generates an intermediate output signal that is an inherent LOS scan enable signal. The multiplexer receives the test input signal and the intermediate output signal, and outputs the test input signal. The flip-flop circuit receives the test input signal as a second input signal, the clock signal, and the reset signal, and generates the output signal.

13 Claims, 6 Drawing Sheets

SCAN FLIP-FLOP CIRCUIT WITH LOS SCAN ENABLE SIGNAL

BACKGROUND OF THE INVENTION

The present invention relates generally to integrated circuits, and more particularly, to a scan flip-flop circuit.

Integrated circuits (ICs) including system-on-chips (SoCs) integrate various digital and sometimes analog components on a single chip. ICs may have manufacturing defects such as physical failures and fabrication defects that cause the ICs to malfunction. Thus, the ICs need to be tested to detect manufacturing defects. Design for test (DFT) techniques add testability features to ICs that allow automatic test equipment (ATEs) to execute various fault tests using test patterns generated by an automatic test pattern generator (ATPG) on the ICs to identify manufacturing defects. ICs undergoing testing are referred to as circuits-under-test (CUT).

Conventional fault tests can be categorized as two types—functional testing and structural testing (also referred to as scan-based testing). Functional testing technique use mathematical models to simulate manufacturing defects and test an IC. However, due to the increasing complexity of ICs, generating such mathematical models has become increasingly difficult. Structural testing techniques are robust techniques that do not require sophisticated mathematical models to detect manufacturing defects. Instead, the manufacturing defects are modeled as logic faults that can be detected using simple memory elements such as flip-flops. Generally, ICs that undergo fault testing include multiple scan flip-flops that form a scan-chain and then test data is shifted in one end of the scan chain and out the other with the starting data compared to the shift out data to detect any faults.

Structural testing includes various fault models such as stuck-at fault, transition fault and path delay fault models. The stuck-at fault model is used to detect faulty connections between circuit elements that cause the CUT to be stuck at a particular logic state. The transition fault model is used to detect a failure of state transition at a particular element of the CUT that propagates through the CUT within a specific time period. The path delay fault model calculates a sum of delays at each element in a path within the CUT and detects faults by comparing the sum of delays of the path with a delay of a critical path.

Fault test methods that use the transition fault model require a test pattern pair (V1, V2) that are vectors to be applied to the CUTs by way of the scan flip-flops of the scan chain. The scan flip-flops function as a gateway to test the CUTs and an observation point to observe the test results of the CUTs. During an initialization cycle, the test pattern V1 is applied to the scan flip-flops at an initialization clock pulse to initialize the CUT to a first logic state. During a launch clock cycle, the test pattern V2 is applied (launched) as a test input to the scan flip-flops. The scan flip-flops receive a scan enable signal from a tester (i.e., ATE). When the scan enable signal transitions from high to low, the scan flip-flops receive the test pattern V2 as input at a launch clock pulse. The test pattern V2 initiates state transitions from the first logic state to a second logic state. During a capture clock cycle, the logic state transitions are captured by the scan flip-flops at a capture clock pulse. The scan enable signal then transitions from low to high. The time period between the launch and capture clock pulses, during which the test pattern V2 is applied is referred to as an application period. Typically, the application period is equivalent to the time period when the IC operates at a maximum clock speed. This is referred to as at-speed testing. Thus, the launch and capture clock pulses are a pair of at-speed clock pulses. At-speed testing is important to ensure that the CUT operates correctly even at high clock speeds.

Based on the transition timing of the scan enable signal from high to low while launching the test patterns, fault test methods that use transition fault models can be categorized into two methods—launch-on-shift (LOS) and launch-on-capture (LOC).

In the LOS method, the scan enable signal is set to the logic low state during a positive edge of a last shift clock pulse, which is the last shift cycle of the scan flip-flop. Thus, the last shift clock pulse is the launch clock pulse. The result of the LOS method is captured at the subsequent at-speed clock pulse that is the capture clock pulse. ATPGs used to generate test patterns for the LOS method are referred to as combinational ATPGs. The combinational ATPGs require less time and a simple vector matrix to generate the test patterns that detect the faults in the CUT. Further, the combinational ATPGs do not include any memory elements.

In the LOC method, the transition of the scan enable signal from the logic high to the logic low state is independent of the launch clock pulse of the scan flip-flop. When the scan enable signal is low, the pair of at-speed clock pulses (launch and capture clock pulses) is applied to initiate the logic state transitions and capture the fault test results at the scan flip-flops. The ATPGs used to generate the test patterns for the LOC method are referred to as sequential ATPGs. A sequential ATPG searches for a sequence of test patterns that allow detection of a particular fault. As a result, sequential ATPGs require more time and a complex vector matrix to generate test patterns. Since a sequence of test patterns is used for fault detection, the sequential ATPGs include memory elements.

The LOS method provides high fault coverage and requires fewer test patterns than the LOC method. Since LOS requires fewer patterns, testing time for LOS is less than the test time using LOC. However, LOS requires the scan enable signal to switch at-speed, i.e., transition from the high to low at the maximum clock speed of the IC. Thus, the scan enable signal needs to be timed at a high functional frequency of the maximum clock speed. Further, since the scan enable signal is fanned out to each scan flip-flop of the scan chain, a large number of buffers and signal boosters are required to meet the timing requirement of the scan enable signal. Thus, timing criticality is introduced into the design of the scan flip-flop that results in an increase in area and power consumption of the IC.

Tester pads that generate the scan enable signal do not support high frequency signals and hence, generating a scan enable signal that is capable of switching at-speed is difficult. Further, the switching of the scan enable signal needs to be synchronized with the last shift clock pulse of the scan flip-flop. As a result, the testing procedure needs to be timed to ensure synchronization between the switching of the scan enable signal and the last shift clock pulse (launch clock pulse). These limitations increase the effort required when using LOS.

FIG. 1A is a schematic block diagram of a conventional scan flip-flop circuit 100 used for LOS testing. The scan flip-flop circuit 100 includes pipeline and scan flip-flops 102 and 104 and an OR gate 106. The pipeline flip-flop 102 has a data input terminal that receives a scan enable signal (SEN) from a scan enable port (SEN_port), which is a tester pad, a clock input terminal that receives a clock signal (CLK), and a data output terminal that generates a scan enable pipeline signal (SEN_pipeline). A first input terminal of the OR gate 106 is connected to the data input terminal of the pipeline flip-flop 102 for receiving the scan enable signal (SEN) and a second input terminal of the OR gate 106 is connected to the data output terminal of the pipeline flip-flop 102 for receiving the scan enable pipeline signal (SEN_pipeline). The OR gate 106 outputs a local scan enable signal (SEN_local). The scan flip-flop 104 has a first data input terminal (D) connected to circuits under test (not shown) to receive fault test results, a second data input terminal (SD) that receives test patterns from an ATE (not shown), a scan enable terminal (SE) connected to the output terminal of the OR gate 106 to receive the local scan enable signal (SEN_local), a clock input terminal that receives the clock signal (CLK), and a data output terminal (Q) connected to the circuit under test to output at least one of the received test patterns and the fault test results based on a logic state of the local scan enable signal (SEN_local).

FIG. 1B is a timing diagram that illustrates the scan enable (SEN), scan enable pipeline (SEN_pipeline) and local scan enable (SEN_local) signals of the scan flip-flop circuit 100. A plurality of clock pulses that include first through third clock pulses 108-112 are generated from T0-T3. The first and second clock pulses 108 and 110 are penultimate shift and last shift clock pulses, respectively, of the scan flip-flop circuit 100. The second and third clock pulses 110 and 112 form a pair of at-speed clock pulses, i.e., launch and capture clock pulses 110 and 112. At time T0, the scan enable (SEN), scan enable pipeline (SEN_pipeline) and local scan enable (SEN_local) signals are at logic high states. Time period T0-T1 is the initialization cycle and the CUTs are initialized using the test pattern V1 at the first clock pulse 108. At the end of the initialization cycle, the ATE sets the scan enable signal (SEN) to the logic low state asynchronously. Time period T1-T2 corresponds to the launch cycle. The scan enable pipeline signal (SEN_pipeline) remains high until the launch clock pulse 110 is received at the scan flip-flop circuit 100. Therefore, the OR gate 106 generates a logic high local scan enable signal (SEN_local) until the positive edge of the second (launch) clock pulse 110. At the positive edge of the launch clock pulse 110, the pipeline flip-flop 102 shifts the logic low scan enable signal (SEN) out as a logic low scan enable pipeline signal (SEN_pipeline). The OR gate 106 receives the logic low scan enable signal (SEN) and the logic low scan enable pipeline signal (SEN_pipeline) and generates a logic low local scan enable signal (SEN_local). The scan flip-flop 104 receives the logic low local scan enable signal (SEN_local) and initiates the state transition of the CUTs based on the test pattern V2 received at the second data input terminal of the flip-flop 104. Thus, the scan flip-flop 104 receives the local scan enable signal (SEN_local) that is synchronized with the launch clock pulse 110. However, this technique requires an increased routing awareness of the CUTs for the insertion of the pipeline flip-flop 102 before the scan flip-flop 104, which complicates the design process. Further, due to insertion of the pipeline flip-flop 102, the scan flip-flop circuit 100 is susceptible to noise glitches from the ATE (not shown) or from within the IC itself and due to crosstalk. Therefore, the timing requirement of the local scan enable signal (SEN_local) may not be met or may be met marginally, which may result in silicon failures across voltage and temperature variations leading to yield loss for the LOS method. Thus, the test result of the LOS method is not deterministic and may include errors.

Therefore, it would be advantageous to have a scan flip-flop circuit that allows CUTs to be tested using LOS independent of the type of ATPG.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1A:
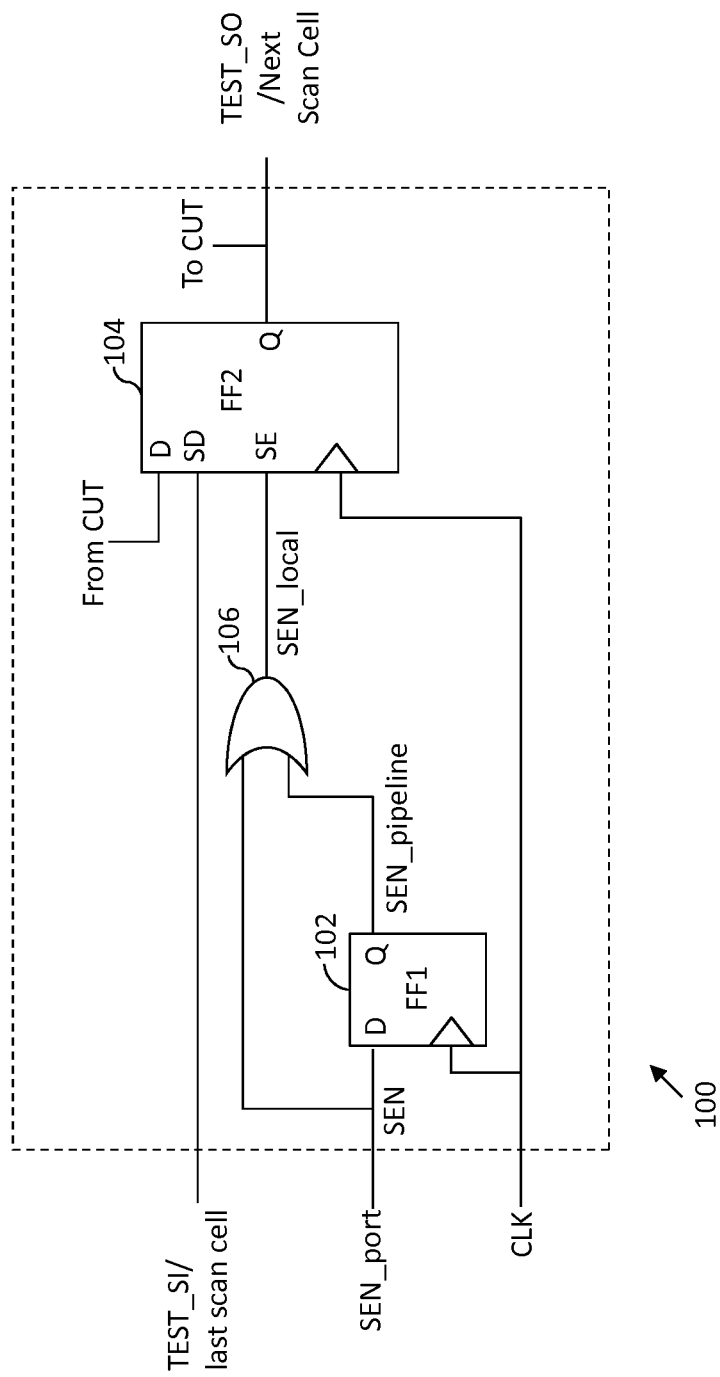
FIG. 1A is a schematic block diagram of a conventional scan flip-flop circuit.
Figure 1B:
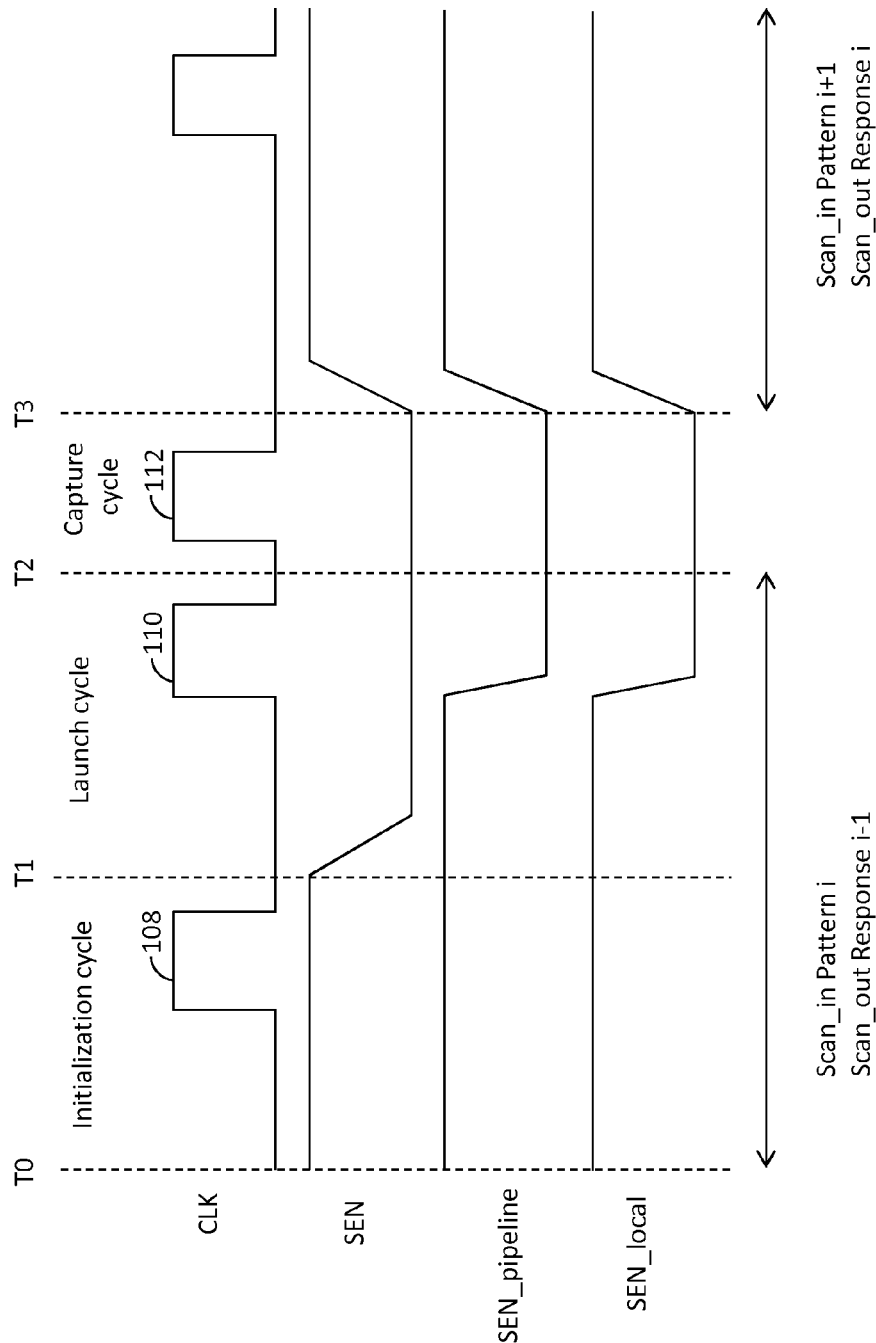
FIG. 1B is a timing diagram illustrating a plurality of signals of the conventional scan flip-flop circuit of FIG. 1A.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. In the description, the terms multiplexer and mux are used interchangeably.

In an embodiment of the present invention, a circuit for generating an output signal based on a first input signal, a clock signal, a test input signal, a launch-off-shift (LOS) signal, a test enable signal, and a reset signal is provided. The circuit includes a logic circuit, a multiplexer and a flip-flop circuit. The logic circuit receives an inverted clock signal, the test enable signal, a test enable intermediate signal, and the LOS signal and generates an intermediate output signal at an output terminal thereof. The multiplexer has a first input terminal for receiving the first input signal, a second input terminal for receiving the test input signal, a select input terminal connected to the output terminal of the logic circuit for receiving the intermediate output signal, and an output terminal for outputting at least one of the first input and test input signals based on the intermediate output signal. The flip-flop circuit has an input terminal connected to the output terminal of the multiplexer for receiving the at least one of the first input and test input signals as a second input signal, a clock input terminal for receiving the clock signal, a reset terminal for receiving the reset signal, and an output terminal for generating the output signal based on the second input signal, the clock signal, and the reset signal.

In another embodiment of the present invention, a flip-flop circuit for generating an output signal based on an input signal and a clock signal is provided. The flip-flop circuit includes: a first transistor having a source terminal for receiving a supply voltage, and a gate terminal for receiving a test enable intermediate signal; a second transistor having a source terminal connected to a drain terminal of the first transistor, and a gate terminal for receiving the input signal; a third transistor having a source terminal for receiving the supply voltage, and a gate terminal for receiving an inverted test enable signal; a fourth transistor having a source terminal connected to a drain terminal of the third transistor, and a gate terminal for receiving a test input signal; a fifth transistor having a source terminal connected to a drain terminal of the fourth transistor, a gate terminal for receiving the inverted test enable signal, and a drain terminal connected to a drain terminal of the second transistor; a sixth transistor having a source terminal connected to the drain terminals of the second and fifth transistors, and a gate terminal for receiving the clock signal; a seventh transistor having a drain terminal connected to a drain terminal of the sixth transistor, and a gate terminal for receiving an inverted clock signal; an eighth transistor having a drain terminal connected to a source terminal of the seventh transistor, and a gate terminal for receiving the input signal; a ninth transistor having a drain terminal connected to a source terminal of the eighth transistor, a gate terminal for receiving the inverted test enable signal, and a source terminal connected to ground; a tenth transistor having a drain terminal connected to the source and drain terminals of the seventh and eighth transistors, respectively, and a gate terminal for receiving the test enable intermediate signal; an eleventh transistor having a drain terminal connected to a source terminal of the tenth transistor, and a gate terminal for receiving the test input signal; a twelfth transistor having a drain terminal connected to a source terminal of the eleventh transistor, a gate terminal for receiving the test enable intermediate signal, and a source terminal connected to ground; a thirteenth transistor having a source terminal connected to the source and drain terminals of the eighth and ninth transistors, respectively, a gate terminal for receiving the inverted test enable signal, and a drain terminal connected to the drain and source terminals of the third and fourth transistors, respectively, wherein the test enable intermediate signal is generated at the drain terminal of the thirteenth transistor; a fourteenth transistor having a source terminal for receiving the supply voltage, and a gate terminal for receiving the test enable intermediate signal; a fifteenth transistor having a source terminal for receiving the supply voltage, a gate terminal for receiving the inverted clock signal, and a drain terminal connected to a drain terminal of the fourteenth transistor; a sixteenth transistor having a source terminal connected the drain terminals of the fourteenth and fifteenth transistors, and a gate terminal for receiving the inverted clock signal; a seventeenth transistor having a source terminal connected a drain terminal of the sixteenth transistor, and a drain terminal connected to the drain terminals of the sixth and seventh transistors; an eighteenth transistor having a drain terminal connected to the drain terminal of the seventeenth transistor, and a gate terminal connected to a gate terminal of the seventeenth transistor; a nineteenth transistor having a drain terminal connected to a source terminal of the eighteenth transistor, a gate terminal for receiving the clock signal, and a source terminal connected to ground; a twentieth transistor having a source terminal for receiving the supply voltage, and a gate terminal for receiving an inverted reset signal; a twenty-first transistor having a source terminal connected to a drain terminal of the twentieth transistor, and a gate terminal connected to the drain terminals of the sixth and seventh transistors; a twenty-second transistor having a drain terminal connected to a drain terminal of the twenty-first transistor, a gate terminal connected to the gate terminal of the twenty-first transistor, and a source terminal connected to ground; a twenty-third transistor having a drain terminal connected to the drain terminals of the twenty-first and twenty-second transistors, a gate terminal connected to the gate terminal of the twentieth transistor, and source terminal connected to ground, wherein the drain terminals of the twenty-first through twenty-third transistors are connected to the gate terminals of the seventeenth and eighteenth transistors; a twenty-fourth transistor having a source terminal for receiving the supply voltage, and a gate terminal connected to the drain terminals of the twenty-first through twenty-third transistors; a twenty-fifth transistor having a drain terminal connected to a drain terminal of the second transistor; a sixth transistor having a source terminal connected to the drain terminals of the second and fifth transistors, and a gate terminal for receiving the clock signal; a drain terminal connected to a drain terminal of the twenty-fourth transistor, a gate terminal connected to the gate terminal of the twenty-fourth transistor, and a source terminal connected to ground; a twenty-sixth transistor having a gate terminal for receiving the inverted clock signal; a twenty-seventh transistor having a gate terminal for receiving the clock signal, a drain terminal connected to a source terminal of the twenty-sixth transistor, and a source terminal connected to a drain terminal of the twenty-sixth transistor; a twenty-eighth transistor having a source terminal for receiving the supply voltage, and a gate terminal connected to the drain and source terminals of the twenty-sixth and twenty-seventh transistors; a twenty-ninth transistor having a drain terminal connected to a drain terminal of the twenty-eighth transistor, a gate terminal connected to the gate terminal of the twenty-eighth transistor, and a source terminal connected to ground; a thirtieth transistor having a source terminal for receiving the supply voltage, and a gate terminal for receiving the clock signal; a thirty-first transistor having a source terminal connected to a drain terminal of the thirtieth transistor; a thirty-second transistor having a drain terminal connected to a drain terminal of the thirty-first transistor, and a gate terminal connected to a gate terminal of the thirty-first transistor and to the drain terminals of the twenty-eighth and twenty-ninth transistors; a thirty-third transistor having a drain terminal connected to a source terminal of the thirty-second transistor, and a gate terminal for receiving the inverted clock signal; a thirty-fourth transistor having a drain terminal connected to a source terminal of the thirty-third transistor, a source terminal connected to ground, and a gate terminal for receiving a reset signal; a thirty-fifth transistor having a source terminal for receiving the supply voltage, a gate terminal for receiving the reset signal, and a drain terminal connected to the drain terminals of the thirty-first and thirty-second transistors and to the gate terminals of the twenty-eight and twenty-ninth transistors; a thirty-sixth transistor having a source terminal for receiving the supply voltage, and a gate terminal connected to the gate terminals of the twenty-eighth and twenty-ninth transistors; and a thirty-seventh transistor having a drain terminal connected to a drain terminal of the thirty-sixth transistor, a gate terminal connected to the gate terminal of the thirty-sixth transistor, and a source terminal connected to ground, wherein the output signal is generated at the drain terminals of the thirty-sixth and thirty-seventh transistors.

Various embodiments of the present invention provide a scan flip-flop circuit for generating an output signal based on a first input signal, a clock signal, a test input signal (which are test patterns generated by an automatic test pattern generator), a launch-off-shift (LOS) signal, a test enable signal (also referred to as scan enable signal), and a reset signal is provided. The scan flip-flop circuit includes a logic circuit, a multiplexer and a flip-flop circuit. The logic circuit receives an inverted clock signal, the test enable signal, a test enable intermediate signal, and the LOS signal and generates an intermediate output signal at an output terminal thereof. To select the LOC method, the LOS signal is set to a logic low state. Since the LOS signal is at a logic low state, the intermediate output signal is generated independent of the clock signal and is equivalent to the test enable signal. The multiplexer receives the test input signal and the intermediate output signal, and outputs the test input signal. The flip-flop circuit receives the test input signal as a second input signal, the clock signal, the reset signal, and generates the output signal. To select the LOS method, the LOS signal is set to a logic high state. The intermediate output signal is generated based on the inverted clock signal, the test enable signal and the test enable intermediate signal. Since the intermediate output signal switches at the positive edge of the clock signal (launch clock pulse), the switching of the intermediate output signal is synchronous with the launch clock pulse. The multiplexer receives the intermediate output signal and outputs the test input signal. The flip-flop circuit receives the test input signal as a second input signal, the clock signal, the reset signal, and generates the output signal. Thus, the scan flip-flop circuit enables the LOS method that mitigates the need of timing the fault testing cycle (the time period during which the CUTs are tested for manufacturing defects) and prevents the need of generating the test enable signal at high frequency. Therefore, timing criticality is not introduced in the design of the scan flip-flop circuit, and hence area and power consumption of the SoC is reduced. Further, the scan flip-flop circuit does not include any pipeline flip-flops, and hence, the LOS method is devoid of any noise glitches from an automatic test equipment (ATE) or crosstalk and provides a deterministic LOS method.

Figure 2:
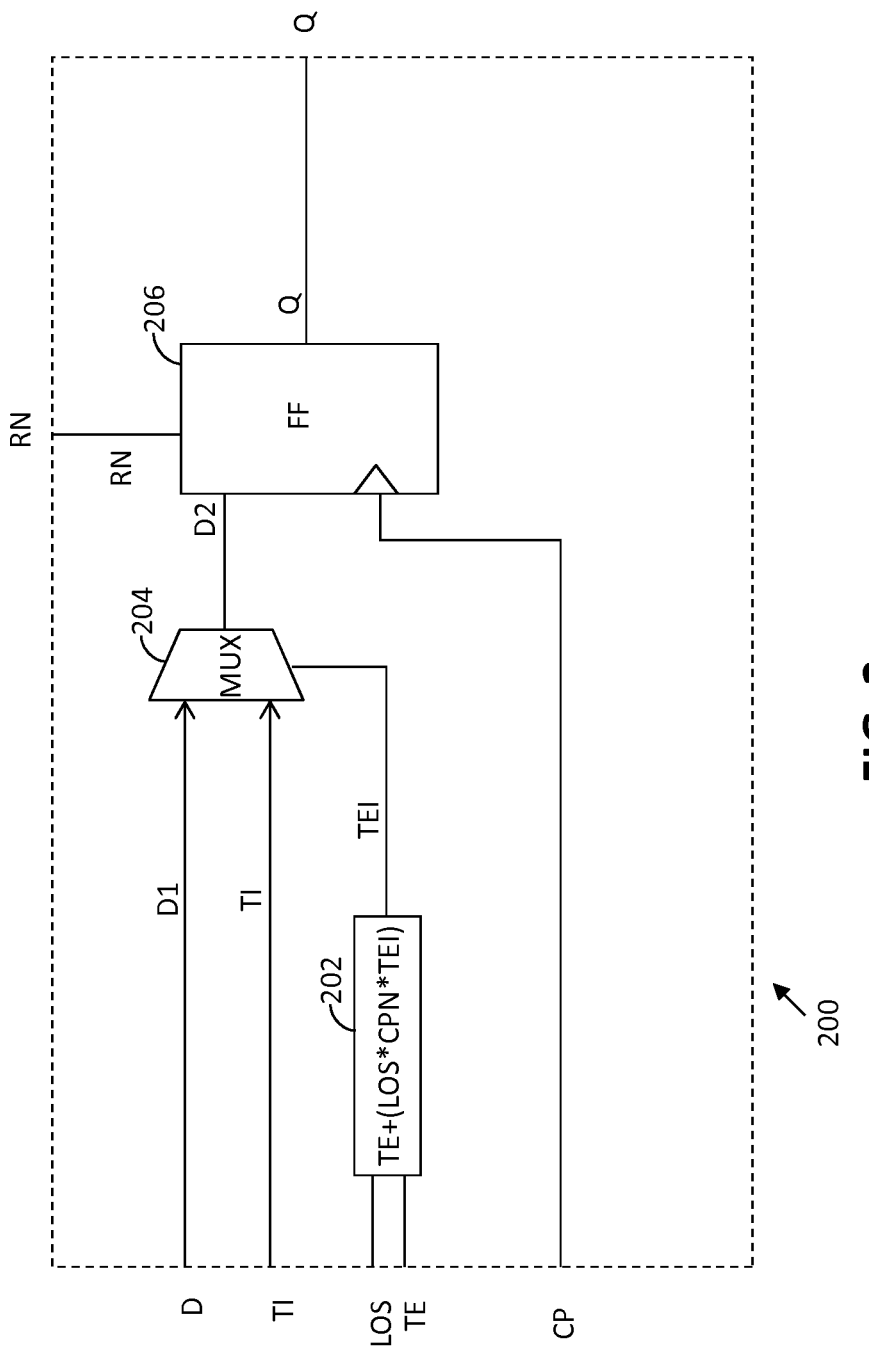
FIG. 2 is a schematic block diagram of a scan flip-flop circuit, in accordance with an embodiment of the present invention.

Referring now to FIG. 2, a schematic block diagram of a scan flip-flop circuit 200 in accordance with an embodiment of the present invention is shown. The scan flip-flop circuit 200 includes a logic circuit 202, a multiplexer or mux 204, and a flip-flop circuit 206, The flip-flop circuit 200 LOS, test enable (TE), clock input (CP), test input (TI), data input (D), reset (RN), and data output (Q) pins. The LOS and TE input pins receive LOS and test enable signals (TE), respectively. The LOS and test enable (TE) signals are externally generated signals. For example, the LOS and test enable (TE) signals may be generated by an external automatic test equipment (ATE) (not shown) or a tester (not shown). The clock input (CP) pin receives a clock signal (CP) from an external clock source (not shown). The test input (TI) pin receives a test input signal (TI), which includes test patterns received from an external automatic test pattern generator (ATPG, not shown). For example, the test patterns may be generated by a combinational ATPG. The data input (D) pin receives a first input signal (D1) and is representative of data to be shifted in to the scan flip-flop circuit 200. The reset (RN) pin receives a reset signal (RN) that resets the scan flip-flop circuit 200. For example, the first input (D1) and reset (RN) signals may be generated by either the ATE or the tester. An output signal is obtained at the data output (Q) pin of the flip flop circuit 206.

The logic circuit 202 is connected to the LOS and TE input pins for receiving the LOS and test enable (TE) signals, respectively. The logic circuit 202 further receives an inverted clock signal (CPN) and a test enable intermediate signal (TEI). The scan flip-flop circuit 200 generates the test enable intermediate signal (TEI) based on the test input signal (TI) and an inverted test enable signal (TEN). The inverted clock signal (CPN), the test enable intermediate signal (TEI) and the inverted test enable signal (TEN) are generated internally (explained later in conjunction with FIG. 3). The logic circuit 202 generates an intermediate output signal (TEI) based on the LOS, test enable (TE), inverted clock (CPN) and test enable intermediate (TEI) signals at an output terminal thereof. The intermediate output signal (TEI) is generated based on the equation (1) below:

Intermediate output signal (TEI)=test enable signal (TE)+LOS signal*inverted clock signal (CPN)*test enable intermediate signal (TEI)   (equation 1)

The test enable intermediate signal (TEI) is a feedback signal of the intermediate output signal (TEI) generated based on the LOS, the test enable (TE) and the inverted clock (CPN) signals.

Table A is a truth table of the output of the logic circuit 202.

TABLE A

| Test enable signal (TE) | LOS signal | Clock signal (CP) | Inverted clock signal (CPN) | Intermediate output signal (TEI) |
|---|---|---|---|---|
| 1 | X | 1 | 0 | 1 |
| 1 | X | 0 | 1 | 1 |
| 1 | 0 | X | X | 1 |
| 0 | 0 | X | X | 0 |
| 0 | 1 | 1 | 0 | 0 |
| 0 | 1 | 0 | 1 | Test enable intermediate signal (TEI) |

As shown in the table A, the ATE sets the LOS signal to a logic low state to initiate the LOC method. As a result, the intermediate output signal (TEI) is equivalent to the test enable signal (TE) and is generated independent of the inverted clock signal (CPN) and hence, the transition of the intermediate output signal (TEI) from a logic high state to a logic low state is independent of the inverted clock signal (CPN) (denoted by 'X', a don't care condition). To perform the LOS method, the ATE or the tester sets the LOS signal to the logic high state. As a result, the intermediate output signal (TEI) is dependent on the inverted clock (CPN), test enable (TE) and test enable intermediate (TEI) signals and hence, the transition of the intermediate output signal (TEI) from the logic high state to the logic low state depends on the inverted clock signal (CPN).

The mux 204 is connected to the logic circuit 202 and the flip-flop circuit 206. A first input terminal of the mux 204 is connected to the data input (D) pin and receives the first input signal (D1). A second input terminal of the mux 204 is connected to the test input (TI) pin and receives the test input signal (TI) (test patterns received from the ATPG). In an embodiment, the test patterns are generated by a combinational ATPG. A select input terminal of the mux 204 is connected to the output terminal of the logic circuit 202 for receiving the intermediate output signal (TEI). Based on the intermediate output signal (TEI), the mux 204 selects and outputs at least one of the first input (D1) and test input (TI) signals as a second input signal (D2) at an output terminal thereof. When the intermediate output signal (TEI) is at a logic high state, the mux 204 selects and outputs the first input signal (D1) as the second input signal (D2). When the intermediate output signal (TEI) is at a logic low state, the mux 204 selects and outputs the test input signal (TI) as the second input signal (D2). In an example, the first input terminal of the mux 204 is connected to CUTs (not shown) for receiving fault test results from the CUTs. Since the intermediate output signal (TEI) is functionally similar to a scan enable signal and is generated internally within the scan flip-flop circuit 200, the intermediate output signal (TEI) is also referred to as an inherent LOS scan enable signal.

The flip-flop circuit 206 is connected to the mux 204 and the CUTs. An input terminal of the flip-flop circuit 206 is connected to the output terminal of the mux 204 for receiving the second input signal (D2). A clock input terminal of the flip-flop circuit 206 is connected to the clock input (CP) pin and receives the clock signal (CP). A reset terminal of the flip-flop circuit 206 is connected to the reset (RN) pin and receives the reset signal (RN). Based on the clock signal (CP), the flip-flop circuit 206 shifts the second input signal (D2) and generates the output signal (Q) at an output terminal thereof. In an example, the output signal (Q) is provided to the CUTs for fault testing.

Figure 3:
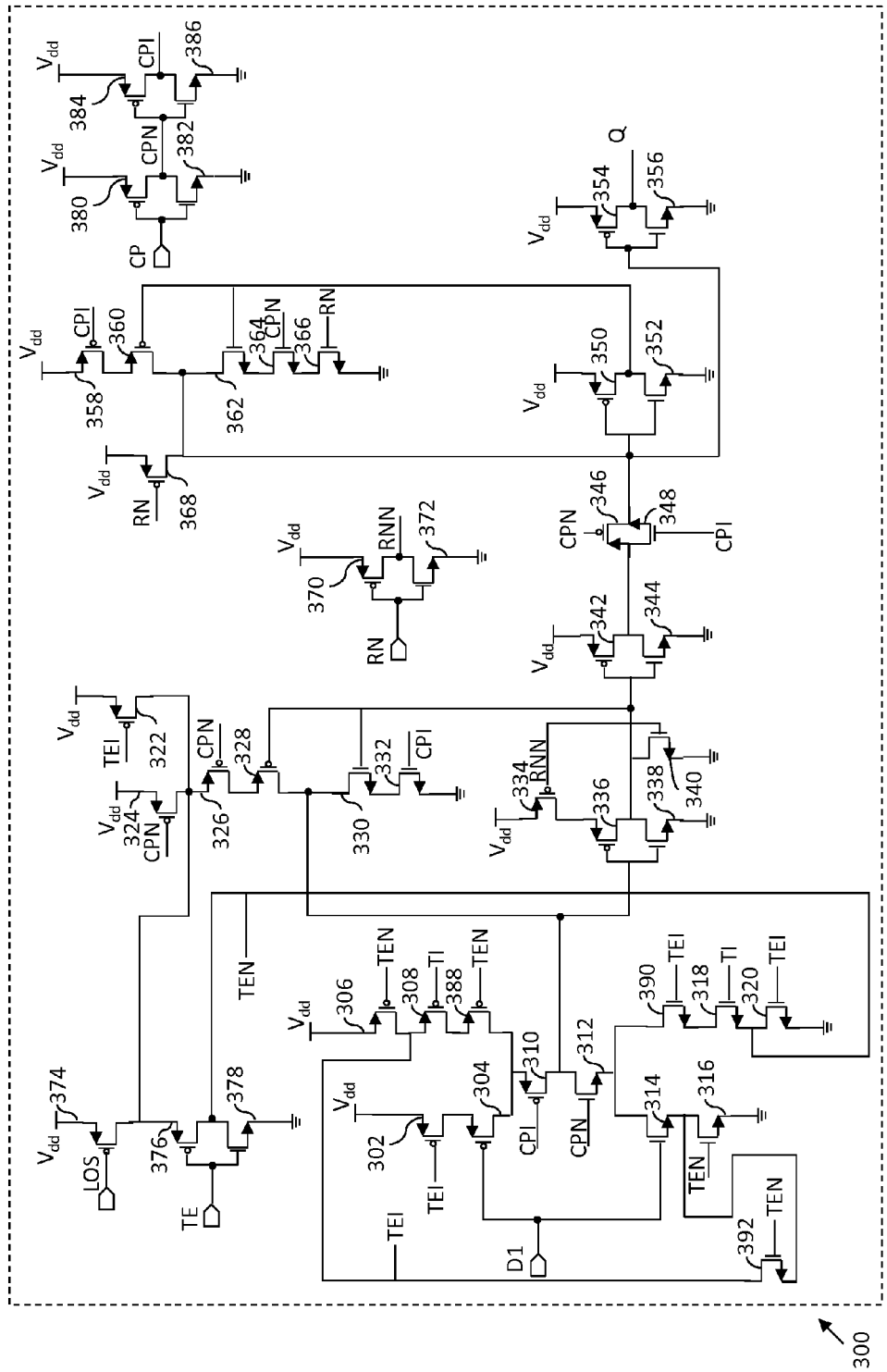
FIG. 3 is a schematic circuit diagram of a scan flip-flop circuit, in accordance with another embodiment of the present invention.

Referring now to FIG. 3, a schematic circuit diagram of a scan flip-flop circuit 300 that represents a transistor-level implementation of the scan flip-flop circuit 200 in accordance with an embodiment of the present invention is shown. The scan flip-flop circuit 300 includes first through forty-sixth transistors 302-392.

A source terminal of the fortieth transistor 380 is connected to a supply voltage $V_{dd}$. A gate terminal of the fortieth transistor 380 is connected to the clock input (CP) pin for receiving the clock signal (CP). A drain terminal of the forty-first transistor 382 is connected to a drain terminal of the fortieth transistor 380. A gate terminal of the forty-first transistor 382 is connected to the gate terminal of the fortieth transistor 380. A source terminal of the forty-first transistor 382 is connected to ground. The inverted clock signal (CPN) is generated at the drain terminals of the fortieth and forty-first transistors 380 and 382. A source terminal of the forty-second transistor 384 is connected to the supply voltage $V_{dd}$. A gate terminal of the forty-second transistor 384 is connected to the drain terminal of the fortieth transistor 380 for receiving the inverted clock signal (CPN). A drain terminal of the forty-third transistor 386 is connected to a drain terminal of the forty-second transistor 384. A gate terminal of the forty-third transistor 386 is connected to the gate terminal of the forty-second transistor 384. A source terminal of the forty-third transistor 386 is connected to ground. The clock signal (CPI) is generated at the drain terminals of the forty-second and forty-third transistors 384 and 386.

The logic circuit 202 includes the thirty-seventh through thirty-ninth transistors 374-378, and eleventh, twelfth, and third transistors 322, 324, and 306. A source terminal of the thirty-seventh transistor 374 is connected to the supply voltage $V_{dd}$. A gate terminal of the thirty-seventh transistor 374 is connected to the LOS pin (LOS) for receiving the LOS signal. A source terminal of the thirty-eighth transistor 376 is connected to a drain terminal of the thirty-seventh transistor 374. A gate terminal of the thirty-eighth transistor 376 is connected to the test enable pin (TE) for receiving the test enable signal (TE). A drain terminal of the thirty-ninth transistor 378 is connected to a drain terminal of the thirty-eighth transistor 376. A gate terminal of the thirty-ninth transistor 378 is connected to the gate terminal of the thirty-eighth transistor 376. A source terminal of the thirty-ninth transistor 378 is connected to ground. An inverted test enable signal (TEN) is generated at the drain terminals of the thirty-eighth and thirty-ninth transistors 376 and 378. A source terminal of the eleventh transistor 322 is connected to the supply voltage $V_{dd}$. A gate terminal of the eleventh transistor 322 receives the test enable intermediate signal (TEI). A drain terminal of the eleventh transistor 322 is connected to the source terminal of the thirty-eighth transistor 376. A source terminal of the twelfth transistor 324 is connected to the supply voltage $V_{dd}$. A gate terminal of the twelfth transistor 324 receives the inverted clock signal (CPN). A drain terminal of the twelfth transistor 324 is connected to the source terminal of the thirty-eighth transistor 376. A source terminal of the third transistor 306 is connected to the supply voltage $V_{dd}$. A gate terminal of the third transistor 306 receives the inverted test enable signal (TEN). The intermediate output signal (TEI) is generated at a drain terminal of the third transistor 306.

A source terminal of the thirty-fifth transistor 370 is connected to the supply voltage $V_{dd}$. A gate terminal of the thirty-fifth transistor 370 is connected to the reset (RN) pin for receiving the reset signal (RN). A drain terminal of the thirty-sixth transistor 372 is connected to a drain terminal of the thirty-fifth transistor 370. A gate terminal of the thirty-sixth transistor 372 is connected to the gate terminal of the thirty-fifth transistor 370. A source terminal of the thirty-sixth transistor 372 is connected to ground. An inverted reset signal (RNN) is generated at the drain terminals of the thirty-fifth and thirty-sixth transistors 370 and 372.

The mux 204 and the flip flop circuit 206 are implemented by using the first and second transistors 302 and 304, fourth through tenth transistors 308-320, thirteenth through thirty-fourth transistors 326-374, and forty-fourth through forty-sixth transistors 388-392. A source terminal of the first transistor 302 is connected to the supply voltage $V_{dd}$. A gate terminal of the first transistor 302 receives the intermediate output signal (TEI). A source terminal of the second transistor 304 is connected to a drain terminal of the first transistor 302. A gate terminal of the second transistor 304 receives the first input signal (D1). A source terminal of the fourth transistor 308 is connected to the drain terminal of the third transistor 306. A gate terminal of the fourth transistor 308 receives the test input signal (TI). A source terminal of the forty-fourth transistor 388 is connected to the drain terminal of the fourth transistor 308. A gate terminal of the forty-fourth transistor 388 receives the inverted test enable signal (TEN). A drain terminal of the forty-fourth transistor 388 is connected to a drain terminal of the second transistor 304.

A source terminal of the fifth transistor 310 is connected to the drain terminal of the second transistor 304. A gate terminal of the fifth transistor 310 receives the clock signal (CPI). A drain terminal of the sixth transistor 312 is connected to a drain terminal of the fifth transistor 310. A gate terminal of the sixth transistor 312 receives the inverted clock signal (CPN).

A drain terminal of the seventh transistor 314 is connected to a source terminal of the sixth transistor 312. A gate terminal of the seventh transistor 314 is connected to the gate terminal of the second transistor 304. A drain terminal of the forty-sixth transistor 392 is connected to the drain terminal of the third transistor 306. A gate terminal of the forty-sixth transistor 392 receives the inverted test enable signal (TEN). A source terminal of the forty-sixth transistor 392 is connected to a source terminal of the seventh transistor 314. A drain terminal of the eighth transistor 316 is connected to the source terminal of the seventh transistor 314. A gate terminal of the eighth transistor 316 receives the inverted test enable signal (TEN). A source terminal of the eighth transistor 316 is connected to ground. A drain terminal of the forty-fifth transistor 390 is connected to the source terminal of the sixth transistor 312. A gate terminal of the forty-fifth transistor 390 receives the intermediate output signal (TEI). A source terminal of the forty-fifth transistor 390 is connected to a source terminal of the seventh transistor 314. A drain terminal of the ninth transistor 318 is connected to the source terminal of the forty-fifth transistor 390. A gate terminal of the ninth transistor 318 receives the test input signal (TI). A source terminal of the ninth transistor 318 is connected to the drain terminal of the thirty-eighth transistor 376 for receiving the inverted test enable signal (TEN). A drain terminal of the tenth transistor 320 is connected to the source terminal of the ninth transistor 318. A gate terminal of the tenth transistor 320 receives the intermediate output signal (TEI). A source terminal of the tenth transistor 320 is connected to ground.

A source terminal of the thirteenth transistor 326 is connected to the drain terminal of the eleventh transistor 322. A gate terminal of the thirteenth transistor 326 receives the inverted clock signal (CPN). A source terminal of the fourteenth transistor 328 is connected to a drain terminal of the thirteenth transistor 326. A drain terminal of the fourteenth transistor 328 is connected to the drain terminal of the fifth transistor 310. A drain terminal of the fifteenth transistor 330 is connected to the drain terminal of the fourteenth transistor

328. A gate terminal of the fifteenth transistor 330 is connected to a gate terminal of the fourteenth transistor 328. A drain terminal of the sixteenth transistor 332 is connected to a source terminal of the fifteenth transistor 330. A gate terminal of the sixteenth transistor 332 receives the clock signal (CPI). A source terminal of the sixteenth transistor 332 is connected to ground.

A source terminal of the seventeenth transistor 334 is connected to the supply voltage $V_{dd}$. A gate terminal of the seventeenth transistor 334 receives the inverted reset signal (RNN). A source terminal of the eighteenth transistor 336 is connected to a drain terminal of the seventeenth transistor 334. A gate terminal of the eighteenth transistor 336 is connected to the drain terminal of the fourteenth transistor 328. A drain terminal of the nineteenth transistor 338 is connected to a drain terminal of the eighteenth transistor 336. A gate terminal of the nineteenth transistor 338 is connected to the gate terminal of the eighteenth transistor 336. A source terminal of the nineteenth transistor 338 is connected to ground. A drain terminal of the twentieth transistor 340 is connected to the drain terminal of the eighteenth transistor 336. A gate terminal of the twentieth transistor 340 is connected to the gate terminal of the seventeenth transistor 334 and receives the inverted reset signal (RNN). A source terminal of the twentieth transistor 340 is connected to ground.

A source terminal of the twenty-first transistor 342 is connected to the supply voltage $V_{dd}$. A gate terminal of the twenty-first transistor 342 is connected to the drain terminal of the eighteenth transistor 336. A drain terminal of the twenty-second transistor 344 is connected to a drain terminal of the twenty-first transistor 342. A gate terminal of the twenty-second transistor 344 is connected to the gate terminal of the twenty-first transistor 342. A source terminal of the twenty-second transistor 344 is connected to ground.

A source terminal of the twenty-third transistor 346 is connected to the drain terminal of the twenty-first transistor 342. A gate terminal of the twenty-third transistor 346 receives the inverted clock signal (CPN). A drain terminal of the twenty-fourth transistor 348 is connected to the source terminal of the twenty-third transistor 346. A gate terminal of the twenty-fourth transistor 348 receives the clock signal (CPI). A source terminal of the twenty-fourth transistor 348 is connected to a drain terminal of the twenty-third transistor 346.

A source terminal of the twenty-fifth transistor 350 is connected to the supply voltage $V_{dd}$. A gate terminal of the twenty-fifth transistor 350 is connected to the source terminal of the twenty-fourth transistor 348. A drain terminal of the twenty-sixth transistor 352 is connected to a drain terminal of the twenty-fifth transistor 350. A gate terminal of the twenty-sixth transistor 352 is connected to the gate terminal of the twenty-fifth transistor 350. A source terminal of the twenty-sixth transistor 352 is connected to ground.

A source terminal of the twenty-ninth transistor 358 is connected to the supply voltage $V_{dd}$. A gate terminal of the twenty-ninth transistor 358 receives the clock signal (CPI). A source terminal of the thirtieth transistor 360 is connected to a drain terminal of the twenty-ninth transistor 358. A gate terminal of the thirtieth transistor 360 is connected to the drain terminal of the twenty-fifth transistor 350. A drain terminal of the thirty-first transistor 362 is connected to a drain terminal of the thirtieth transistor 360. A gate terminal of the thirty-first transistor 362 is connected to the gate terminal of the thirtieth transistor 360. A drain terminal of the thirty-second transistor 364 is connected to a source terminal of the thirty-first transistor 362. A gate terminal of the thirty-second transistor 364 receives the inverted clock signal (CPN). A drain terminal of the thirty-third transistor 366 is connected to a source terminal of the thirty-second transistor 364. A gate terminal of the thirty-third transistor 366 receives the reset signal (RN). A source terminal of the thirty-third transistor 366 is connected to ground. A source terminal of the thirty-fourth transistor 368 is connected to the supply voltage $V_{dd}$. A gate terminal of the thirty-fourth transistor 368 receives the reset signal (RN). A drain terminal of the thirty-fourth transistor 368 is connected to the drain terminal of the thirtieth transistor 360.

A source terminal of the twenty-seventh transistor 354 is connected to the supply voltage $V_{dd}$. A gate terminal of the twenty-seventh transistor 354 is connected to the gate terminal of the twenty-fifth transistor 350. A drain terminal of the twenty-eighth transistor 356 is connected to a drain terminal of the twenty-seventh transistor 354. A gate terminal of the twenty-eighth transistor 356 is connected to the gate terminal of the twenty-seventh transistor 354. A source terminal of the twenty-eighth transistor 356 is connected to ground. The output signal (Q) is generated at the drain terminals of the twenty-seventh and twenty-eighth transistors 354 and 356.

It will be apparent to those of skill in the art that the scan flip-flop circuit 300 is a part of a scan chain of the IC or SoC (not shown). The scan chain includes multiple such scan flip-flop circuits 300 that are connected in series. During a time period when no signal is being propagated between the scan flip-flop circuit 300 and a subsequent scan flip-flop circuit 300, the third, fourth, ninth, tenth, forty-fourth, and forty-fifth transistors 306, 308, 318, 320, 388 and 390 introduce a delay in the test input signal (TI) path (also referred to as a scan path). As a result, the scan flip-flop circuit 300 prevents the need of implementing multiple buffers to introduce delay, thereby further decreasing area and power consumption of the SoC. Further, the third, fourth, ninth, tenth, forty-fourth, and forty-fifth transistors 306, 308, 318, 320, 388 and 390 introduce the delay only in the scan path and not the first input signal (D1) path (also referred to as a functional path). Thus, an operational frequency of the integrated circuit is not affected.

Figure 4A:
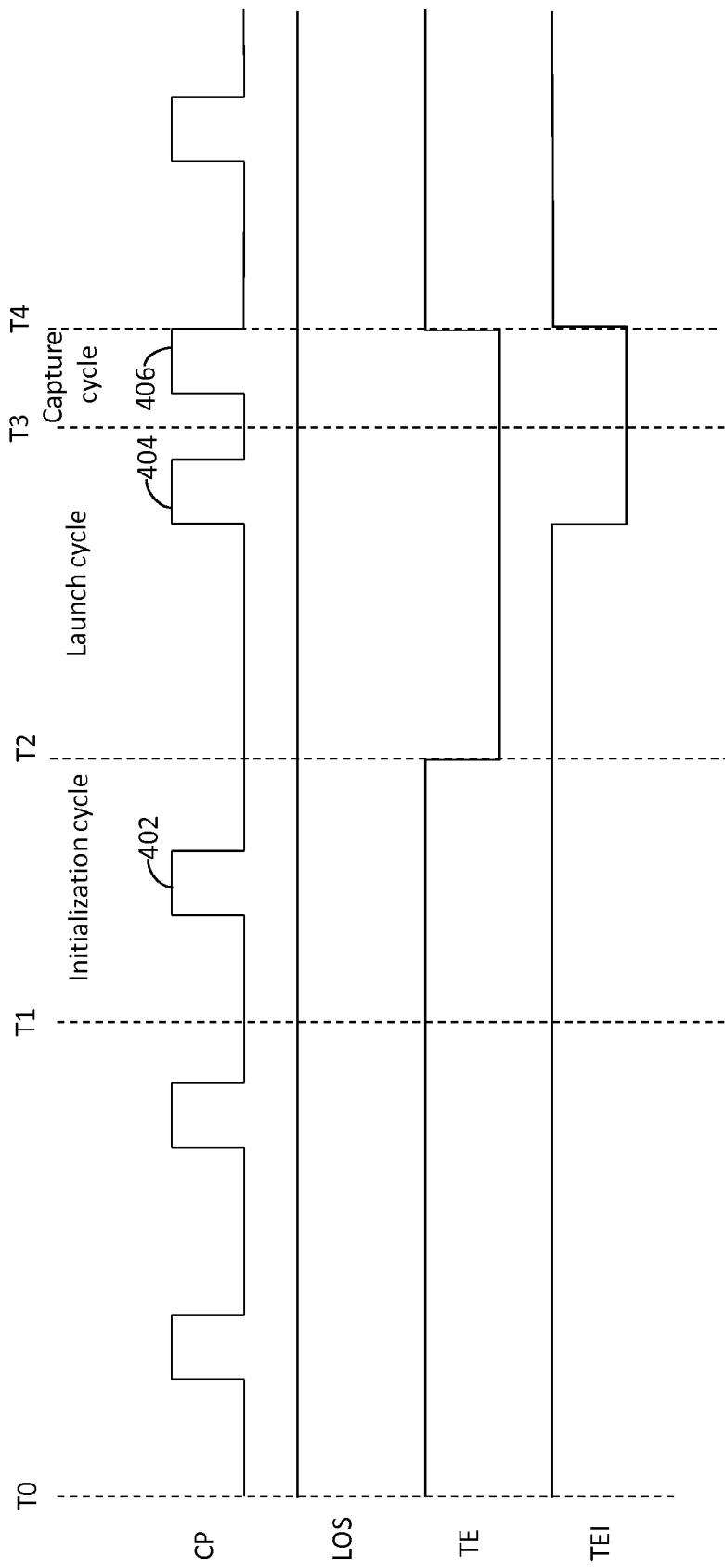
FIGS. 4A and 4B are timing diagrams illustrating a plurality of signals of the scan flip-flop circuit, in accordance with another embodiment of the present invention.

Referring now to FIG. 4A, a timing diagram illustrating the clock (CP), LOS, test enable (TE) and intermediate output (TEI) signals of the scan flip-flop circuit 200 is shown. A plurality of clock pulses that include first through third clock pulses 402-406 are generated during the time period T0-T4. In an example, the second and third clock pulses 404 and 406 are at-speed clock pulses used in the LOC method. The ATE or the tester sets the LOS signal to a logic high state as the scan flip-flop circuit 200 implements the LOS method of fault testing. During T0-T1, the LOS, test enable (TE) and intermediate output (TEI) signals are at a logic high state. Thus, although the clock signal (CP) toggles between logic high and logic low states, the logic circuit 202 generates the intermediate output signal (TEI) at a logic high state. The time period T1-T2 is an initialization cycle and the CUTs connected to the flip-flop circuit 206 are initialized at the first clock pulse 402 (hereinafter referred to as "initialization clock pulse") to a first logic state.

At the end of the initialization cycle, the ATE sets the test enable signal (TE) to a logic low state asynchronously. The time period T2-T3 is a launch cycle. The clock signal (CP) remains at a logic low state until the second clock pulse 404 (hereinafter referred to as "launch clock pulse") is received at the scan flip-flop circuit 200, and hence the inverted clock signal (CPN) is at a logic high state until the launch clock pulse 404 is received. Since the LOS, inverted clock (CPN) and test enable intermediate (TEI) signals are at a logic high state, the logic circuit 202 continues to generate the intermediate output signal (TEI) at a logic high state. When the scan flip-flop circuit 200 receives the launch clock pulse 404, the clock signal (CP) transitions to a logic high state. Thus, the inverted clock signal (CPN) transitions to a logic low state. Since the test enable signal (TE) is at a logic low state, the logic circuit 202 generates the test enable signal (TE) at a logic low state. Thus, the transition of the intermediate output signal (TEI) is synchronized with the launch clock pulse 404, and hence, enables the LOS method of fault testing. Further, the test enable signal (TE) can be set asynchronously and hence, can be generated using conventional tester pads. Further, the method and design of the scan flip-flop circuit 200 enables the scan flip-flop circuit 200 to be used with combinational and sequential ATPGs for fault testing. The mux 204 receives the logic low intermediate output signal (TEI) and outputs the test input signal (TI) as the second input signal (D2). The flip-flop circuit 206 receives the second input signal (D2) and generates the output signal (Q). Further, during the launch cycle, although the clock signal (CP) toggles between logic high and logic low states, the logic circuit 202 retains the intermediate output signal (TEI) at a logic low state. The time period T3-T4 is a capture cycle. The scan flip-flop circuit 200 captures the LOS method test results at the third clock pulse 406 (hereinafter referred to as "capture clock pulse"). At the end of the capture cycle, i.e., at time instance T4, the ATE asynchronously sets the test enable signal (TE) to a logic high state. Therefore, logic circuit 202 generates the intermediate output signal (TEI) at a logic high state indicating the end of the LOS method of fault testing.

Figure 4B:
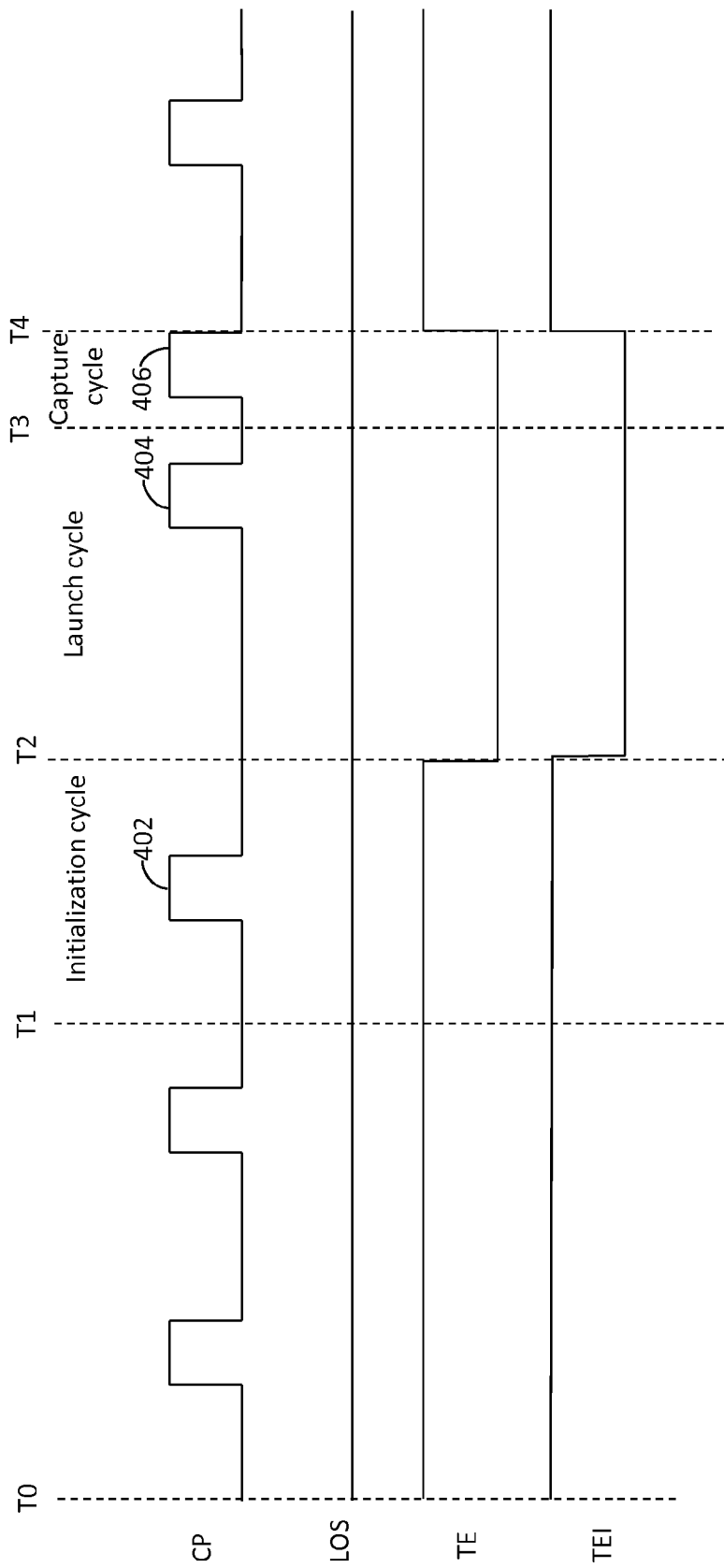

Referring now to FIG. 4B, a timing diagram illustrating the clock (CP), LOS, test enable (TE) and intermediate output (TEI) signals of the scan flip-flop circuit 200 implementing the LOC method is shown. The ATE or the tester sets the LOS signal to a logic low state as the scan flip-flop circuit 200 implements the LOC method of fault testing. During T0-T1, the test enable signal (TE) is at a logic high state. Thus, although the clock signal (CP) toggles between logic high and logic low states, the logic circuit 202 generates the TEI signal that is identical to the test enable signal (TE). The intermediate output signal (TEI) is generated at a logic high state. The time period T1-T2 is the initialization cycle and the CUTs connected to the flip-flop circuit 206 are initialized at the initialization clock pulse 402. At the end of the initialization cycle, the ATE sets the test enable signal (TE) to a logic low state asynchronously. Since the intermediate output signal (TEI) is same as the test enable signal (TE), the logic circuit 202 generates the intermediate output signal (TEI) at a logic low state. Thus, the intermediate output signal (TEI) transitions to the logic low state asynchronously and hence, enables the LOC method of fault testing. The mux 204 selects the test input signal (TI) and outputs the test input signal (TI) as the second input signal (D2). The time period T2-T3 is a launch cycle. The launch clock pulse 404 is received at the scan flip-flop circuit 200. The flip-flop circuit 206 receives the second input signal (D2) and generates the output signal (Q) at the launch clock pulse 404. The time period T3-T4 is a capture cycle. The scan flip-flop circuit 200 captures the LOC method test results at the capture clock pulse 406. At the end of the capture cycle, i.e., at time instance T4, the ATE asynchronously sets the test enable signal (TE) to a logic high state. Therefore, the logic circuit 202 generates the intermediate output signal (TEI) at a logic high state indicating the end of the LOC method of fault testing.

In an embodiment of the present invention, the flip-flop circuit 206 is a positive-edge triggered D-type flip-flop with active low asynchronous reset. The first, second, third, fourth, fifth, eleventh, twelfth, thirteenth, fourteenth, seventeenth, eighteenth, twenty-first, twenty-third, twenty-fifth, twenty-seventh, twenty-ninth, thirtieth, thirty-fourth, thirty-fifth, thirty-seventh, thirty-eighth, fortieth, forty-second, forty-fourth transistors are p-channel metal-oxide semiconductor (PMOS) transistors. Further, the sixth, seventh, eighth, ninth, tenth, eleventh, fifteenth, sixteenth, nineteenth, twentieth, twenty-second, twenty-fourth, twenty-sixth, twenty-eighth, thirty-first, thirty-second, thirty-third, thirty-sixth, thirty-ninth, forty-first, forty-third, forty-fifth and forty-sixth transistors are n-channel metal-oxide semiconductor (NMOS) transistors.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A circuit for generating an output signal based on a first input signal, a clock signal, a test input signal, a launch-off-shift (LOS) signal, a test enable signal, and a reset signal, comprising:
   a logic circuit for generating an intermediate output signal at an output terminal thereof based on an inverted clock signal, the test enable signal, a test enable intermediate signal, and the LOS signal, wherein the intermediate output signal comprises the test enable signal OR the LOS signal AND the inverted clock signal AND the test enable intermediate signal;
   a multiplexer having a first input terminal for receiving the first input signal, a second input terminal for receiving the test input signal, a select input terminal connected to the output terminal of the logic circuit for receiving the intermediate output signal, and an output terminal for outputting one of the first input and test input signals based on the intermediate output signal; and
   a flip-flop circuit having an input terminal connected to the output terminal of the multiplexer for receiving the one of the first input and test input signals as a second input signal, a clock input terminal for receiving the clock signal, a reset terminal for receiving the reset signal, and an output terminal for generating the output signal based on the second input signal, the clock signal, and the reset signal.

2. The circuit of claim 1, wherein the test enable intermediate signal is generated based on the test input signal and an inverted test enable signal.

3. The circuit of claim 1, wherein the circuit is a scan flip-flop circuit.

4. The circuit of claim 3, wherein the scan flip-flop circuit is of a positive-edge triggered D-type flip-flop.

5. A flip-flop circuit for generating an output signal based on an input signal and a clock signal, comprising:
   a first transistor having a source terminal for receiving a supply voltage, and a gate terminal for receiving a test enable intermediate signal;
   a second transistor having a source terminal connected to a drain terminal of the first transistor, and a gate terminal for receiving the input signal;
   a third transistor having a source terminal for receiving the supply voltage, and a gate terminal for receiving an inverted test enable signal;
   a fourth transistor having a source terminal connected to a drain terminal of the third transistor, and a gate terminal for receiving a test input signal;

a fifth transistor having a source terminal connected to a drain terminal of the fourth transistor, a gate terminal for receiving the inverted test enable signal, and a drain terminal connected to a drain terminal of the second transistor;

a sixth transistor having a source terminal connected to the drain terminals of the second and fifth transistors, and a gate terminal for receiving the clock signal;

a seventh transistor having a drain terminal connected to a drain terminal of the sixth transistor, and a gate terminal for receiving an inverted clock signal;

an eighth transistor having a drain terminal connected to a source terminal of the seventh transistor, and a gate terminal for receiving the input signal;

a ninth transistor having a drain terminal connected to a source terminal of the eighth transistor, a gate terminal for receiving the inverted test enable signal, and a source terminal connected to ground;

a tenth transistor having a drain terminal connected to the source and drain terminals of the seventh and eighth transistors, respectively, and a gate terminal for receiving the test enable intermediate signal;

an eleventh transistor having a drain terminal connected to a source terminal of the tenth transistor, and a gate terminal for receiving the test input signal;

a twelfth transistor having a drain terminal connected to a source terminal of the eleventh transistor, a gate terminal for receiving the test enable intermediate signal, and a source terminal connected to ground;

a thirteenth transistor having a source terminal connected to the source and drain terminals of the eighth and ninth transistors, respectively, a gate terminal for receiving the inverted test enable signal, and a drain terminal connected to the drain and source terminals of the third and fourth transistors, respectively, wherein the test enable intermediate signal is generated at the drain terminal of the thirteenth transistor;

a fourteenth transistor having a source terminal for receiving the supply voltage, and a gate terminal for receiving the test enable intermediate signal;

a fifteenth transistor having a source terminal for receiving the supply voltage, a gate terminal for receiving the inverted clock signal, and a drain terminal connected to a drain terminal of the fourteenth transistor;

a sixteenth transistor having a source terminal connected the drain terminals of the fourteenth and fifteenth transistors, and a gate terminal for receiving the inverted clock signal;

a seventeenth transistor having a source terminal connected a drain terminal of the sixteenth transistor, and a drain terminal connected to the drain terminals of the sixth and seventh transistors;

an eighteenth transistor having a drain terminal connected to the drain terminal of the seventeenth transistor, and a gate terminal connected to a gate terminal of the seventeenth transistor;

a nineteenth transistor having a drain terminal connected to a source terminal of the eighteenth transistor, a gate terminal for receiving the clock signal, and a source terminal connected to ground;

a twentieth transistor having a source terminal for receiving the supply voltage, and a gate terminal for receiving an inverted reset signal;

a twenty-first transistor having a source terminal connected to a drain terminal of the twentieth transistor, and a gate terminal connected to the drain terminals of the sixth and seventh transistors;

a twenty-second transistor having a drain terminal connected to a drain terminal of the twenty-first transistor, a gate terminal connected to the gate terminal of the twenty-first transistor, and a source terminal connected to ground;

a twenty-third transistor having a drain terminal connected to the drain terminals of the twenty-first and twenty-second transistors, a gate terminal connected to the gate terminal of the twentieth transistor, and a source terminal connected to ground, wherein the drain terminals of the twenty-first through twenty-third transistors are connected to the gate terminals of the seventeenth and eighteenth transistors;

a twenty-fourth transistor having a source terminal for receiving the supply voltage, and a gate terminal connected to the drain terminals of the twenty-first through twenty-third transistors;

a twenty-fifth transistor having a drain terminal connected to a drain terminal of the twenty-fourth transistor, a gate terminal connected to the gate terminal of the twenty-fourth transistor, and a source terminal connected to ground;

a twenty-sixth transistor having a gate terminal for receiving the inverted clock signal, and a source terminal connected to the drain terminals of the twenty-fourth and twenty-fifth transistors;

a twenty-seventh transistor having a gate terminal for receiving the clock signal, a drain terminal connected to the source terminal of the twenty-sixth transistor, and a source terminal connected to a drain terminal of the twenty-sixth transistor;

a twenty-eighth transistor having a source terminal for receiving the supply voltage, and a gate terminal connected to the drain and source terminals of the twenty-sixth and twenty-seventh transistors;

a twenty-ninth transistor having a drain terminal connected to a drain terminal of the twenty-eighth transistor, a gate terminal connected to the gate terminal of the twenty-eighth transistor, and a source terminal connected to ground;

a thirtieth transistor having a source terminal for receiving the supply voltage, and a gate terminal for receiving the clock signal;

a thirty-first transistor having a source terminal connected to a drain terminal of the thirtieth transistor;

a thirty-second transistor having a drain terminal connected to a drain terminal of the thirty-first transistor, and a gate terminal connected to a gate terminal of the thirty-first transistor and to the drain terminals of the twenty-eighth and twenty-ninth transistors;

a thirty-third transistor having a drain terminal connected to a source terminal of the thirty-second transistor, and a gate terminal for receiving the inverted clock signal; and a thirty-fourth transistor having a drain terminal connected to a source terminal of the thirty-third transistor, a source terminal connected to ground, and a gate terminal for receiving a reset signal;

a thirty-fifth transistor having a source terminal for receiving the supply voltage, a gate terminal for receiving the reset signal, and a drain terminal connected to the drain terminals of the thirty-first and thirty-second transistors and to the gate terminals of the twenty-eight and twenty-ninth transistors;

a thirty-sixth transistor having a source terminal for receiving the supply voltage, and a gate terminal connected to the gate terminals of the twenty-eighth and twenty-ninth transistors; and a thirty-seventh transistor having a drain terminal connected to a drain terminal of the thirty-sixth transistor, a gate terminal connected to the gate terminal of the thirty-sixth transistor, and a source terminal connected to ground, wherein the output signal is generated at the drain terminals of the thirty-sixth and thirty-seventh transistors.

6. The flip-flop circuit of claim 5, further comprising:

a thirty-eighth transistor having a source terminal for receiving the supply voltage, and a gate terminal for receiving the reset signal; and a thirty-ninth transistor having a drain terminal connected to a drain terminal of the thirty-eighth transistor, a gate terminal connected to the gate terminal of the thirty-eighth transistor, and a source terminal connected to ground, wherein the inverted reset signal is generated at the drain terminals of the fortieth and forty-first transistors.

7. The flip-flop circuit of claim 6, further comprising:

a fortieth transistor having a source terminal for receiving the supply voltage, a gate terminal for receiving a LOS signal, and a drain terminal connected to the drain terminals of the fourteenth and fifteenth transistors;

a forty-first transistor having a source terminal connected to the drain terminal of the fortieth transistor, and a gate terminal for receiving a test enable signal; and a forty-second transistor having a drain terminal connected to a drain terminal of the forty-first transistor, a gate terminal connected to the gate terminal of the forty-first transistor, and a source terminal connected to ground, wherein the inverted test enable signal is generated at the drain terminals of the forty-first and forty-second transistors, and wherein the drain terminals of the forty-first and forty-second transistors are connected to the source and drain terminals of the eleventh and twelfth transistors, respectively.

8. The flip-flop circuit of claim 7, further comprising:

a forty-third transistor having a source terminal for receiving the supply voltage, and a gate for receiving an input clock signal (CP); and a forty-fourth transistor having a drain terminal connected to a drain terminal of the forty-third transistor, a gate terminal connected to the gate terminal of the forty-third transistor, and a source terminal connected to ground, wherein the inverted clock signal is generated at the drain terminals of the forty-third and forty-fourth transistors.

9. The flip-flop circuit of claim 8, further comprising:

a forty-fifth transistor having a source terminal for receiving the supply voltage, and a gate terminal for receiving the inverted clock signal; and a forty-sixth transistor having a drain terminal connected to a drain terminal of the forty-fifth transistor, a gate terminal connected to the gate terminal of the forty-fifth transistor, and a source terminal connected to ground, wherein the clock signal is generated at the drain terminals of the forty-fifth and forty-sixth transistors.

10. The flip-flop circuit of claim 9, wherein the seventh, eighth, ninth, tenth, eleventh, twelfth, thirteenth, fifteenth, eighteenth, nineteenth, twenty-second, twenty-third, twenty-fourth, twenty-seventh, twenty-ninth, thirty-second, thirty-third, thirty-fourth, thirty-seventh, thirty-ninth, forty-second, forty-fourth, and forty-sixth transistors are n-channel metal-oxide semiconductor (NMOS) transistors.

11. The flip-flop circuit of claim 9, wherein the first, second, third, fourth, fifth, sixth, fourteenth, fifteenth, sixteenth, seventeenth, twentieth, twenty-first, twenty-fourth, twenty-sixth, twenty-seventh, thirtieth, thirty-first, thirty-fifth, thirty-sixth, thirty-eighth, fortieth, forty-first, forty-third, and forty-fifth transistors are p-channel metal-oxide semiconductor (PMOS) transistors.

12. The flip-flop circuit of claim 5, wherein the flip-flop circuit is of a positive-edge triggered D-type flip-flop.

13. The circuit of claim 5, wherein the circuit is a scan flip-flop circuit.

* * * * *